United States Patent [19]

Donofrio et al.

[11] 3,718,826

[45] Feb. 27, 1973

[54] FET ADDRESS DECODER

[75] Inventors: Nicholas M. Donofrio, Wappingers Falls; Richard H. Linton, Poughkeepsie, both of N.Y.

[73] Assignee: International Business Machines Corp., Armonk, N.Y.

[22] Filed: June 17, 1971

[21] Appl. No.: 154,103

[52] U.S. Cl. ....................307/251, 307/304

[51] Int. Cl. ....................H03k 17/00

[58] Field of Search ...307/205, 221 E, 251, 279, 304

[56] References Cited

UNITED STATES PATENTS

| | | | |
|---|---|---|---|
| 3,564,290 | 2/1971 | Sonoda | 307/251 |
| 3,609,406 | 9/1971 | Walther | 307/251 |
| 3,513,365 | 5/1970 | Levi | 307/251 |
| 3,373,295 | 3/1968 | Lambert | 307/238 |
| 3,397,353 | 8/1968 | Hitt | 321/44 |
| 3,573,490 | 4/1971 | Sevin, Jr. | 307/221 C |
| 3,599,010 | 8/1971 | Crawford | 307/221 C |

*Primary Examiner*—Stanley D. Miller, Jr.
*Assistant Examiner*—R. E. Hart
*Attorney*—James E. Murray et al.

[57] ABSTRACT

This specification described a logic circuit having a capacitor coupled between the gate and the drain of an FET. The capacitor used is a polarized voltage dependent capacitor and the voltage across this capacitor is controlled to render the FET conductive or nonconductive to selectively gate or not gate pulses applied to the drain of the FET through the FET to a load connected to the source of the FET. When signals are not to be gated through the FET the voltage across the capacitor is maintained at zero potential and the capacitor exhibits substantially zero capacitance. When signals are to be gated through the FET a voltage of a particular potential and polarity is maintained across the capacitor so that the capacitor exhibits a high capacitance. In operation this logic circuit does not form a significant load on the source of potential driving it when the FET is gated nonconductive.

8 Claims, 4 Drawing Figures

INVENTORS
NICHOLAS M. DONOFRIO
RICHARD H. LINTON

BY [signature]
ATTORNEY

FET ADDRESS DECODER

BACKGROUND OF THE INVENTION

The present invention relates to logic circuits employing FET devices and more particularly to inverters, decoders and complementary generators.

In Sonoda U.S. Pat. No. 3,564,290 assigned to the same assignee of the present application, a FET logic circuit is described in which a feedback capacitor is connected between the gate and the source of the FET. This feedback capacitor is charged to a potential greater than the threshold level of the FET to permit the FET to conduct current from the drain to the source of the FET. The feedback capacitor when so charged continuously feeds back the potential at the source of the FET to the gate of the FET so that the potential at the gate rises with the potential at the source to maintain the potential difference between the gate and the source of the FET in excess of the threshold level for the FET irrespective of the potential generated across the load by the current passed through the FET.

It would be preferable that the feedback capacitor used in the circuit of the mentioned Sonoda patent be connected between the drain and gate of the FET instead of between the source and gate of the FET. By coupling the feedback capacitor between the drain and the gate advantage may be taken of the fact that the drain rises significantly faster than the source. However, in the usual situation where these circuits are used, a multiplicity of the circuits are connected to a common driving point. Therefore while a feedback capacitor coupled to the drain in one of the circuits would not materially effect performance when so coupled in all the circuits would form a significant load on the source driving the circuits. Therefore, in accordance with the present invention a new circuit is provided which does have a capacitor connected between the gate and drain for improved performance, but does not significantly change the load on the driving point where a multiplicity of such circuits is used. This circuit employs a polarized voltage dependent capacitor. When this polarized capacitor is discharged or back-biased it presents an extremely small load to the driving point but when it is forward-biased it provides a high capacitance to the driving point. Each of the circuits in this multiplicity of circuits is then operated so that the feedback capacitor is discharged or back-biased when it is not selected for operation. The unselected circuits therefore do not function as a substantial load on the driving point and since one circuit by itself will not significantly load the driving point the improvement in performance is obtained without placing more severe restrictions on the driving source.

Therefore, it is an object of the present invention to provide a logic circuit with improved operating performance.

It is another object of the invention to minimize capacitance loading.

It is another object of the invention to provide a faster FET inverter or complementary generator that provides output signals of the same magnitude as the operating potentials applied to the terminals of the circuit.

Another object of the invention is to increase the speed of FET logic circuits without substantially increasing the power dissipation of the circuits when they are operating in matrices or groups.

DESCRIPTION OF THE DRAWINGS

These and other objects, features and advantages of the invention will be apparent from the following more particular description of the preferred embodiment of the invention as illustrated in the accompanying drawings, of which:

In FIG. 1 a plurality of decoder circuits 10 are shown being driven from a common driving point 12. The circuits are identical and as shown for circuit 10*a* each includes a plurality of enhancement mode MOSFET devices Q1 — Q5. As illustrated, the drain of device Q1 is connected to the gate of device Q1 by a feedback capacitor Cf. In accordance with the present invention this feedback capacitor Cf is a polarized voltage dependent capacitor whose capacitance varies with the potential substantially as illustrated in FIG. 2. When there is little or no voltage across the capacitor or the capacitor is back-biased, the capacitance of the capacitor is very low. However, when a voltage of the proper polarity and magnitude is impressed across the capacitor the capacitance of the capacitor increases markedly.

Figure 1:
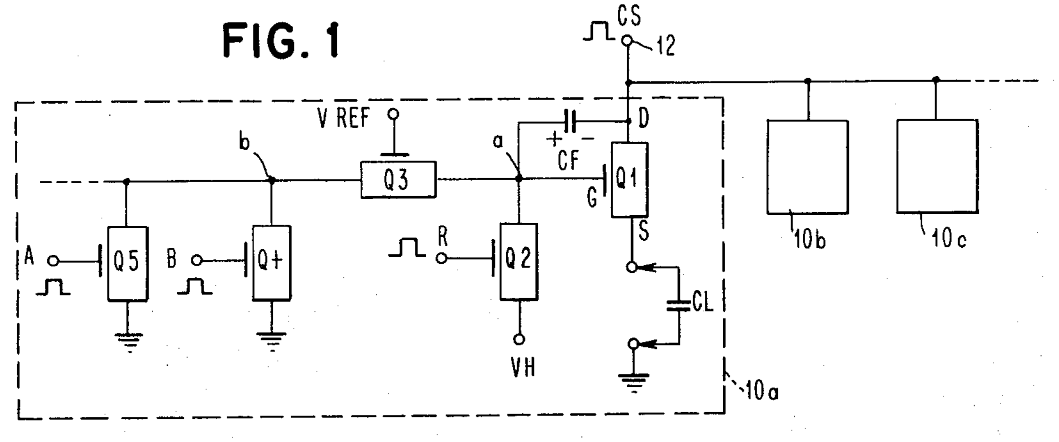
FIG. 1 shows an electrical schematic of the preferred embodiment of the invention.

The drain of the device Q1 is connected to a driving point 12, providing a pulse called the chip select pulse CS, and the source of the device 12 is connected to a capacitive load represented by capacitor CL. Whether a chip select pulse CS is passed through device Q1 or not depends on the charge on capacitor Cf. If capacitor Cf is charged so that node a is more positive than the drain of device Q1 then device Q1 will conduct transferring the chip select pulse CS from the drain to the source of device Q1 thereby charging the load capacitance CL. If node *a* is not charged more positively with respect to the drain or is negative with respect to the drain, then device Q1 will be biased off preventing the chip select pulse CS from reaching the load capacitance CL.

The charge on capacitor Cf is controlled by devices Q2 - Q5 where devices Q4 and Q5 are merely representative of a plurality of devices used to perform a decoding function. Prior to the application of the chip select pulse CS and before the application of decoding pulses A and B, a restore pulse R is applied to the gate of device Q2 in each of the decoders 10*a* - 10*c* turning on device Q2 and charging node a from the source VH. This biases the feedback capacitor Cf so that node *a* is more positive than the drain of device Q1 in each of the decoders 10*a* - 10*c*. It also causes device Q3 to conduct current from node *a* to node *b* since the positive potential Vref applied to its gate is greater than the potential at node *b*. As node *b* charges the potential at node *b* increases and cuts off device Q3. In addition it references the voltage on CL to ground potential through device Q1.

With nodes *a* and *b* charged the circuits 10*a* – 10*c* are ready to receive the decoding pulses A and B. Let us assume that in circuits 10*b* and 10*c* a pulse is applied to the gate of either or both of devices Q4 and Q5 while in device 10*a* no such pulse is applied to the gate of either device Q4 or Q5. Therefore, in circuit 10*b* or 10*c* either or both devices Q4 and Q5 are rendered conductive discharging the node *b* to ground. This causes device Q3 to conduct again so that node *a* is similarly discharged to ground through devices Q3 and Q4. With node *a* in circuits 10*b* and 10*c* discharged to ground this means that capacitor Cf is discharged so that there is substantially zero potential across capacitor Cf and therefore capacitor Cf has approximately zero capacitance. As shall be seen later this maintains device Q1 off in both circuits 10*b* and 10*c*.

In circuit 10*a* where no pulse is applied to the gating terminal of device Q4 or Q5 node *b* remains charged. Device Q3 therefore remains off maintaining node *a* at an up potential. This, of course, means that feedback capacitor Cf in circuit 10*a* is charged so that node *a* is at a higher potential than the drain of device Q1. As shall be seen later, this renders device Q1 conductive.

After a decoding pulse has been applied the chip select pulse CS is applied to the driving point 12. In circuits 10*b* and 10*c*, where node *a* has been discharged to ground through devices Q3 and Q4, the gate of device Q1 is not at a threshold level above the source of device Q1 so that device Q1 in both circuits 10*b* and 10*c* is biased off to the chip select pulse CS and there is no transferance of energy from the driving point 12 to the capacitive load CL. In circuit 10*a*, where node *a* is positive, the gate of device Q1 is higher than the source of device Q1 by an amount equal to or greater than the threshold level of device Q1 so that device Q1 conducts and transfers energy from the driving point 12 to the capacitance CL. As capacitance CL charges up, the source of the device Q1 rises tending to reduce the potential between the gate and source. However, node *a* also rises since it is connected through capacitor Cf to the drain of device Q1, and feeds the potential at the drain to node *a*. Therefore, the source of device Q1 is free to rise to the full potential of the chip select pulse CS without cutting off device Q1.

Since the feedback capacitor Cf is connected between the drain and gate of device Q1 instead of between the source and gate, the circuit operates a lot faster since the drain rises faster than the source. Furthermore, in the off devices 10*b* and 10*c* the capacitor Cf does not constitute a significant load to the driving point 12 because the capacitor Cf is discharged and therefore exhibits little capacitance.

Figure 3:
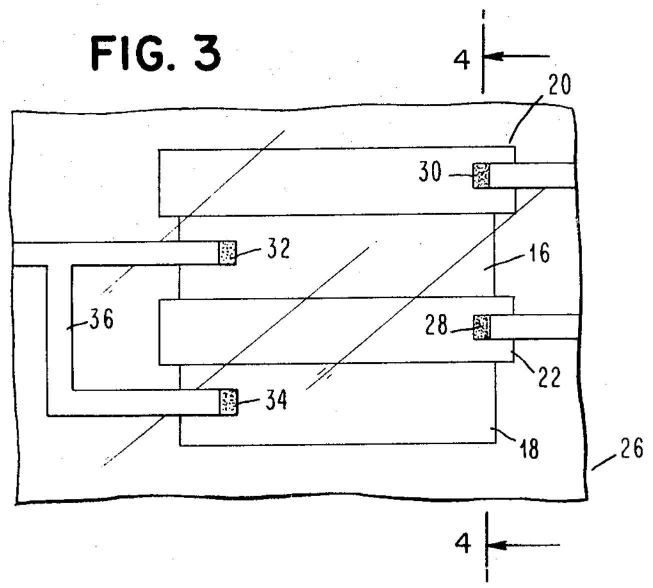
FIG. 3 is a plan view of a monolithic structure for the circuit shown in FIG. 1.
Figure 4:
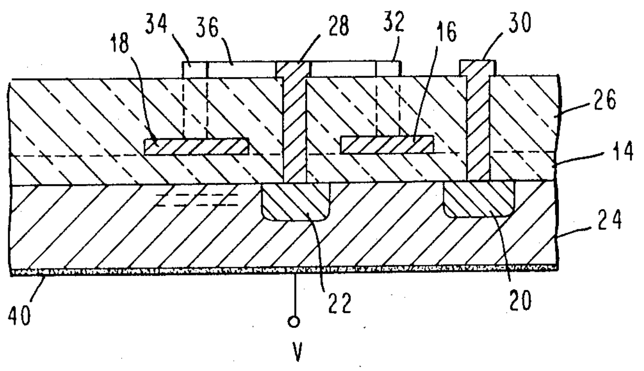
FIG. 4 is a section taken through the monolithic structure of FIG. 3 along line 4—4.

The device Q1 and feedback capacitor Cf can be constructed as shown in FIGS. 3 and 4 using the silicon gate process. In the silicon gate process a silicon layer is laid down over an oxide layer on a monolithic chip. The silicon layer is then etched away in areas where the drain and source diffusions are to be made and remaining sections of the silicon layer are used as gate areas for the field effect transistor and for connections. As shown, the silicon layer overlaying the thin oxide layer 14 is split by etching into two sections, one section 16 forming the gate for the field effect transistor Q1 and the other section 18 forming one of the plates for the capacitor Cf. The oxide layer 14 is then stripped away in two strips for the receipt of the diffusions for the source and drain. The N-type diffusions 20 and 22 are then made into the P-type substrate 24 to form the source and drain diffusions, respectively. Once the diffusions are complete a thick oxide layer 26 is formed to overlay the whole structure and it is etched to receive metalization to form the metal contacts 28, 30, 32 and 34 to the drain, source, gate and plate, respectively. The gate and plate contacts 32 and 34 are joined by a metal strip 36 to make the gate-to-capacitor connection and a negative potential −V is applied to the substrate 24 through a metal layer 40 to provide the substrate bias. Now, when the gate terminal 32 is made positive with respect to the drain terminal 30, charge is drawn under the plate 18 from the −V substrate bias providing a negative charge layer under the plate 18. This negative charge neutralizes the rectifying junction of the drain diffusion 22 adjacent the plate 18 so that the drain diffusion 22 and the negative charge 38 form a continuous conductive second plate of the capacitor Cf and the thin oxide layer 14 under the plate 18 forms the dielectric for the capacitor.

Figure 2:
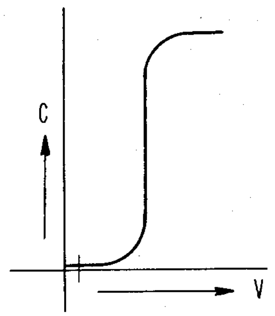
FIG. 2 shows the capacitance versus voltage characteristics of the feedback capacitor used in the preferred embodiment of the invention.

The capacitance of this capacitor (between plate 18 and diffusion 22) is a function of the potential and varies in accordance with the curve of FIG. 2. When the potential between the plate 18 and diffusion 22 is zero the capacitance is negligible. However, as the voltage applied between the gate and source is increased the capacitance goes up markedly until some potential is reached where the capacitance levels off. It is found in making capacitors in the manner described above higher capacitances could be obtained than in other ways of making capacitors on monolithic chips.

In fabricating the structure a normal impurity level for FET's can be used. For instance, the P substrate can have impurity concentration of $10^{16}$ impurities/$CM^3$ while diffusions 20 and 22 and conductive layers 16 and 18 can have impurity concentration of $10^{20}$ impurities/$CM^3$. The A.C. current path from the conducting layer 18 to the diffusion 22 is a high impedance due to the presence of the rectifying junction. However, as pointed out above, the negative charge attracted under the conducting plate forms a conductor which lowers the impedance of this path and creates a capacitor between the plate 18 and the diffusion 22.

Therefore, while the invention has been shown and described with respect to a preferred embodiment thereof, it will be understood by those skilled in the art that various changes in form and detail may be made therein without departing from the spirit and scope of the invention.

What is claimed is:

1. A gating circuit comprising:

a. an FET device having a gating terminal and two gated terminals;

b. pulsing means for the application of a drive pulse to the first of the gated terminals;

c. a load connected to the second of the gated terminals;

d. biasing means for impressing a biasing potential on the gating terminal prior to the application of the drive pulse to the first of the gated terminals; and e. a voltage sensitive capacitive feedback means coupling the gating terminal to the first of the gated terminals to bias the FET device conductive to said drive pulse by retaining the charge from the biasing potential and by regeneratively feeding the potential at the first of the gated terminals to the gating terminal, said voltage sensitive capacitive feedback means being a capacitor whose capacitance increases as the voltage across it increases from very little capacitance when there is no potential across the capacitor to a higher capacitance when there is sufficient potential across the capacitor in the correct polarity.

2. The gating circuit of claim 1 including discharging means for selectively discharging the charge retained by the capacitor feedback means after the biasing potential has been applied to the gate but prior to the application of the drive pulse to the first of the gated terminals.

3. The gating circuit of claim 2 wherein:

said load is capacitive.

4. The gating circuit of claim 3 wherein said FET device is an enhancement mode metal oxide semiconductor field effect transistor.

5. In a matrix of circuits each with a capacitor that acts as a load on a source supplying drive current to the matrix of circuits to power at least one of the circuits of the matrix while the other circuits of the matrix remain off, the improvement comprising:

a. said capacitor in the circuits being polarity and voltage sensitive to provide a relatively high capacitance when biased with a voltage of the proper polarity and potential and a relatively low capacitance when not so biased;

b. charging means for selectively applying power from the source to the matrix of circuits; and c. means for controlling the potential across the capacitors in the circuits of the matrix to bias the capacitor in at least one of the circuits of the matrix at a relatively high capacitance and other circuits of the matrix at a relatively low capacitance whereby the other circuits of the matrix do not form a substantial load on the source supplying drive current to the matrix.

6. The structure of claim 5 wherein a. each of said circuits contains an FET device with a gating terminal for controlling the current flow between two gated terminals, said FET having its gated terminals connected between the source and a capacitive loading device; and b. said capacitor is a feedback capacitor coupled between the gating terminal and the gated terminal connected to the source.

7. The structure of claim 6 wherein said charging means in each of the circuit comprises a plurality of FET devices for controlling the potential at the gating terminal to thereby bias the capacity between its relatively high and low capacitor states.

8. The structure of claim 7 wherein said plurality of FET devices includes:

a. one FET for raising the potential at said gating terminal in all circuits of the matrix; and b. at least one additional device for selectively lowering the potential at the gating terminal in the other circuits of the matrix.

* * * * *